United States Patent
Skogen

(10) Patent No.: US 12,355,209 B1
(45) Date of Patent: Jul. 8, 2025

(54) CONTINUOUSLY VARIABLE OPTICAL CONFINEMENT FOR OPTICAL AMPLIFIERS

(71) Applicant: National Technology & Engineering Solutions of Sandia, LLC, Albuquerque, NM (US)

(72) Inventor: Erik J. Skogen, Tijeras, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 745 days.

(21) Appl. No.: 17/727,929

(22) Filed: Apr. 25, 2022

(51) Int. Cl.
  *H01S 5/00* (2006.01)
  *H01S 5/20* (2006.01)

(52) U.S. Cl.
  CPC .......... *H01S 5/2031* (2013.01); *H01S 5/2081* (2013.01); *H01S 2301/04* (2013.01)

(58) Field of Classification Search
  CPC ... H01S 5/2031; H01S 5/2081; H01S 2301/04
  See application file for complete search history.

(56) References Cited

U.S. PATENT DOCUMENTS

| | | | |
|---|---|---|---|
| 5,613,020 A * | 3/1997 | Uchida | G02B 6/12004 385/9 |
| 2018/0240820 A1 * | 8/2018 | Hahn | H10D 62/40 |
| 2018/0241176 A1 * | 8/2018 | Abel | H01S 5/2031 |
| 2022/0045481 A1 * | 2/2022 | Aihara | H01S 5/2022 |

FOREIGN PATENT DOCUMENTS

EP           3648269 A1 *   5/2020   ............... H01S 5/50

* cited by examiner

*Primary Examiner* — Mark Hellner
(74) *Attorney, Agent, or Firm* — Mark A. Dodd

(57) ABSTRACT

A semiconductor optical amplifier (SOA) with a variable optical confinement factor Γ along the length of the device is disclosed. At the input end of the SOA, the optical confinement is high as an optical core is adjacent an optical gain layer, resulting in a high-gain region that rapidly increases the optical signal power. In the central portion of the SOA, the optical confinement is continuously reduced as the optical core is tapered away from the optical gain layer, thereby lowering the gain, but increasing the output saturation power. Near the output end of the SOA, the optical confinement factor is held constant, providing a length of additional gain, thereby further increasing the output power. The SOA may optionally include a spot-size converter region to focus the output optical signal.

20 Claims, 4 Drawing Sheets

CONTINUOUSLY VARIABLE OPTICAL CONFINEMENT FOR OPTICAL AMPLIFIERS

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to a semiconductor optical amplifier that simultaneously provides both high gain and high output power by using a continuously variable optical confinement structure.

BACKGROUND

Single pass semiconductor optical amplifiers (SOAs) have traditionally been limited to either high gain or high output power-they have not been able to achieve both simultaneously. The single pass gain Go for an optical amplifier is:

$$G_0 = e^{[(\Gamma g_0 - \alpha_i)L]}, \quad \text{(Eq. 1)}$$

where $\Gamma$ is the optical confinement factor, $g_0$ is the gain coefficient, $\alpha_i$ is the modal loss, and L is the length of the structure. The saturation output power $P_{sat}$ for an SOA having an optical confinement factor of $\Gamma$ is:

$$P_{sat} = \frac{wdh\nu}{a\Gamma\tau}, \quad \text{(Eq. 2)}$$

where wd is the cross-sectional area of the active portion of the device structure, hv is the photon energy, a is the differential gain, and r is the carrier lifetime. By comparing Equations 1 and 2, it is evident that there exists a tradeoff between gain and the saturation output power for a given optical confinement factor $\Gamma$. That is, for a given optical confinement factor $\Gamma$ and device structure, one can generally achieve a particular gain and output saturation power. This puts limits on the overall gain and the achievable output power. Thus, the need exists for an SOA device structure that overcomes the tradeoff limits on gain and output power.

SUMMARY

One aspect of the present invention relates to an SOA device structure with a variable optical confinement factor $\Gamma$ along the length of the device, i.e., $\Gamma(x)$. At the input end of the SOA, the optical confinement is high, resulting in a high-gain region that rapidly increases the optical signal power. In the central portion of the SOA, the optical confinement is reduced, thereby lowering the gain, but increasing the output saturation power. Near the output end of the SOA, the optical confinement factor is held constant, providing a length of additional gain, thereby further increasing the output power. The net effect is that the core of the waveguide in the SOA is moved away from the optical gain layer of the SOA. The SOA may optionally include a spot-size converter region to focus the output optical signal.

In at least one embodiment of the present invention, a semiconductor optical amplifier comprises a lower cladding layer, an optical gain layer on the lower cladding layer (the optical gain layer providing optical gain to an optical signal), a confinement tuning layer on the optical gain layer, a core on the confinement tuning layer (the core having a first core thickness), and an upper cladding layer on the core, wherein the lower cladding layer, the confinement tuning layer, the core, and the upper cladding layer collectively guide the optical signal, a thickness of the confinement tuning layer in a high-gain region has a first confinement layer thickness (the confinement tuning layer in the high-gain region producing a first optical confinement factor), the thickness of the confinement tuning layer in a mid-gain region adjacent the high-gain region is continuously tapered from the first confinement layer thickness to a second confinement layer thickness (the second confinement layer thickness greater than the first confinement layer thickness), and the thickness of the confinement tuning layer in a high-saturation region adjacent the mid-gain region has the second confinement layer thickness (the confinement tuning layer in the high-saturation region producing a second optical confinement factor, the second optical confinement factor less than the first confinement factor).

In other semiconductor optical amplifiers, the optical gain layer includes one of bulk material or multiple quantum wells; the bulk material or multiple quantum wells include at least one of InGaAsP, InGaAs, AlGaAs, InAlGaAs, or GaAs; each of the lower cladding layer, the confinement tuning layer, and the upper cladding layer includes at least one of InP, GaAs, AlGaAs, or InGaP; the core includes at least one of InGaAsP, InGaAs, AlGaAs, GaAs, or InAlGaAs; the first core thickness is between approximately 500 Å and approximately 5,000 Å; the first confinement layer thickness is between approximately 100 Å and approximately 500 Å; the second confinement layer thickness is between approximately 1,000 Å and approximately 5,000 Å; the high-gain region has a length between approximately 10 µm and approximately 500 µm; the mid-gain region has a length between approximately 200 µm and approximately 5,000 µm; the high-saturation region has a length between approximately 1,000 µm and approximately 10,000 µm; the first optical confinement factor is between approximately 2% and approximately 15% and the second optical confinement factor is between approximately 0.1% and approximately 2.0%; a thickness of each of the lower cladding layer and the upper cladding layer is between approximately 1.5 µm and approximately 2.0 µm; and the semiconductor optical amplifier further comprises a substrate, the lower cladding layer on the substrate (the substrate including at least one of InP or GaAs).

In yet other semiconductor optical amplifiers, the core thickness in a spot-size converter region adjacent the high-saturation region is continuously tapered from the first core thickness to a second core thickness, the second core thickness less than the first core thickness; the second core thickness is between approximately 0 Å and approximately 300 Å; the spot-size converter region has a length between approximately 100 µm and approximately 500 µm; a portion of the optical gain layer in the spot-size converter region adjacent the high-saturation region is intermixed such that the portion of the optical gain layer in the spot-size converter region is substantially transparent to the optical signal; the semiconductor optical amplifier further comprises two electrical contacts (the electrical contacts applying a bias across the optical gain layer); and each of the two electrical contacts includes at least one of Ti, Pt, Au, Ge, Ni, or Be.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION

Figure 1:
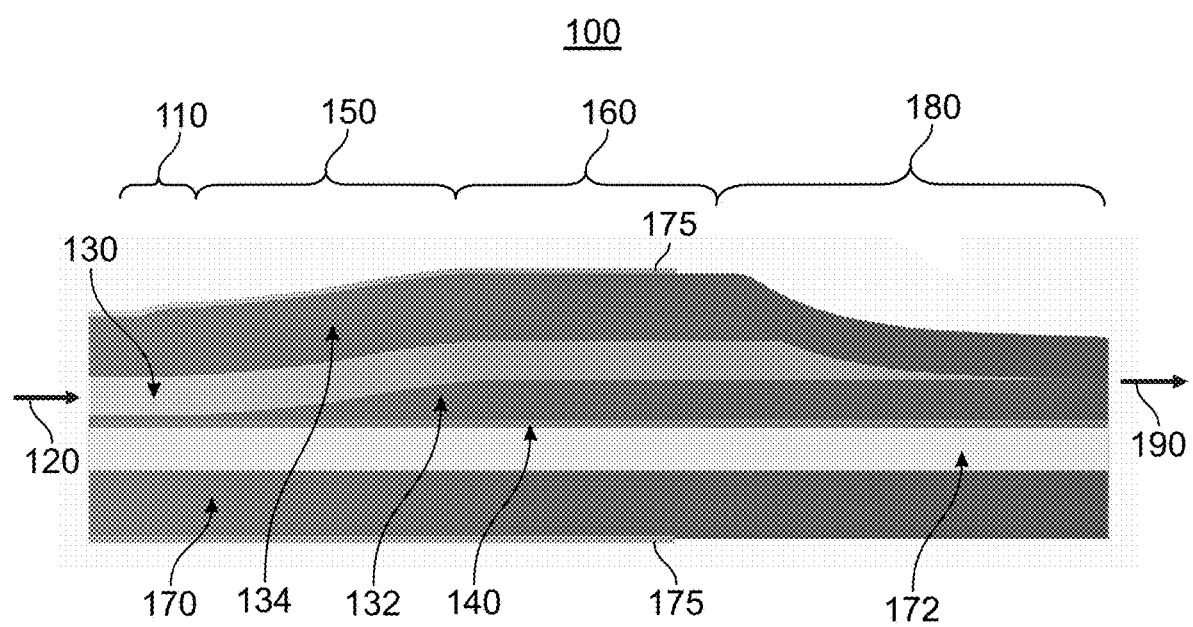
FIG. 1 illustrates a length-wise cross-sectional view of a semiconductor optical amplifier in accordance with one or more embodiments of the present invention.

FIG. 1 illustrates a cross-sectional view of a semiconductor optical amplifier (SOA) 100 in accordance with one or more embodiments along a length direction. The SOA 100 includes a high-gain region 110 at an input end of the SOA 100 to which an input optical signal 120 is applied. The high-gain region 110 has a length, for example, of between approximately 10 μm and approximately 500 μm. In the high-gain region 110, a core 130 of the waveguide is adjacent to an optical gain layer 140 of the SOA 100. The core 130, in the high-gain region 110, has a thickness, for example, of between approximately 500 Å and approximately 5,000 Å. Because the core 130 is adjacent the optical gain layer 140, an optical confinement factor I' will be high, an optical gain G will be high, but the saturation power $P_{sat}$ will be low. In the high-gain region 110, the optical confinement factor I' may be, for example, between approximately 2% and approximately 15%.

In a mid-gain region 150, the separation between the core 130 and the optical gain layer 140 continuously increases. The mid-gain region 150 has a length, for example, of between approximately 200 μm and approximately 5,000 μm. This increasing separation causes a continuous decrease in the optical confinement factor I', a continuous decrease in the optical gain G, but a continuous increase in the saturation power $P_{sat}$. The core 130 is separated from the optical gain layer 140 by a confinement tuning layer 132, with a thickness of the confinement tuning layer 132 continuously increasing in the mid-gain region 150, i.e., the confinement tuning layer 132 is tapered. The confinement tuning layer 132, in the high-gain region 110 and at the start of the mid-gain region 150, has a thickness, for example, of between approximately 100 Å and approximately 500 Å. At the end of the mid-gain region 150 and in a high-saturation region 160, the confinement tuning layer 132 has a thickness, for example, of between approximately 1,000 Å and approximately 5,000 Å.

In the high-saturation region 160, the separation between the core 130 and the optical gain layer 140, i.e., the thickness of the confinement tuning layer 132, remains fixed at a distance large enough to ensure a high saturation power $P_{sat}$. The high-saturation region 160 has a length, for example, of between approximately 1,000 μm and approximately 10,000 μm. At this fixed separation, the optical confinement factor I' has a constant, but relatively lower value, resulting in a constant, but relatively lower optical gain ( ) and a constant, but relatively higher saturation power $P_{sat}$. In the high-saturation region 160, the optical confinement factor I' will be, for example, between approximately 0.1% and approximately 2.0%.

The overall SOA 100 includes a substrate 170 with a lower cladding layer 172 thereon, upon which the optical gain layer 140, the confinement tuning layer 132, the core 130, and an upper cladding layer 134 are formed. The lower cladding layer 172 acts optically as a lower cladding layer for the optical gain layer 140. Electrical contacts 175 are formed, for example, on the top surface of the upper cladding layer 134 and to the backside of the substrate 170, such that a bias may be placed across the optical gain layer 140. To this end, the confinement tuning layer 132, the core 130, and the upper cladding layer 134 are doped with a first type of dopant, while the substrate 170 and the lower cladding layer 172 are doped with a second type of dopant opposite the first type of dopant.

Though not required, the SOA 100 illustrated in FIG. 1 includes an optional spot-size converter region 180. The spot-size converter region 180 has a length, for example, of between approximately 100 μm and approximately 500 μm. As illustrated in FIG. 1, the thickness of the core 130 in the spot-size converter region 180 is reduced, thereby first reducing a diameter of an output optical signal, and, as the thickness of the core 130 is reduced further, expanding the diameter of the output optical signal 190, such that, for example, the output optical mode has a good overlap with an output optical fiber (not illustrated). The core 130 at the end of the spot-size converter region 180 has a thickness, for example, of between approximately 0 Å and approximately 300 Å. In addition, the lower cladding layer 172 and the upper cladding layer 134 each have a thickness, for example, of between approximately 1.5 μm and approximately 2.0 μm for an operating wavelength of 1550 nm, though a thinner lower cladding layer 172 and upper cladding layer 134 may be employed for shorter operating wavelengths.

Figure 2A:
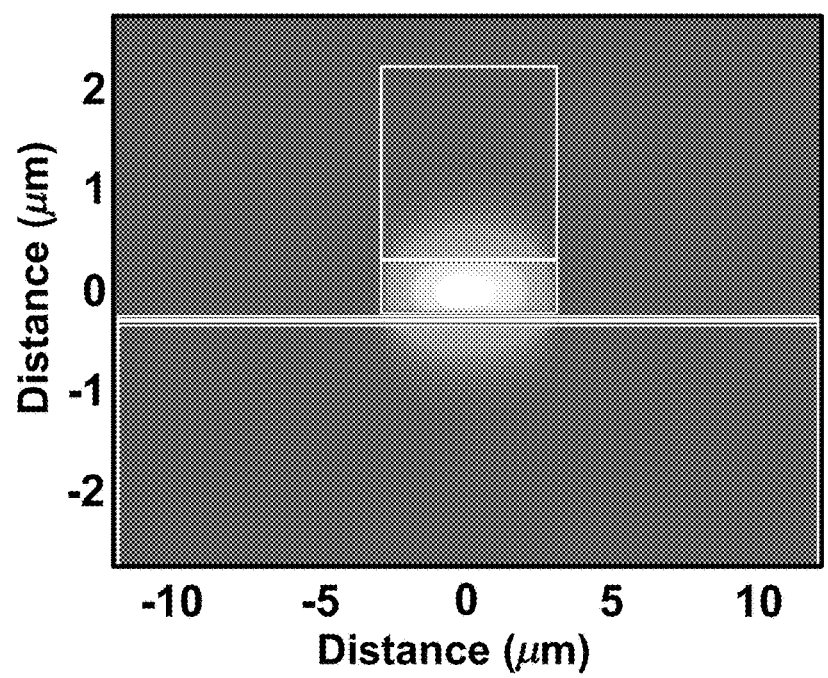
FIGS. 2A-2C illustrate cross-sectional views of the optical mode within a semiconductor optical amplifier in accordance with one or more embodiments of the present invention.
Figure 2B:
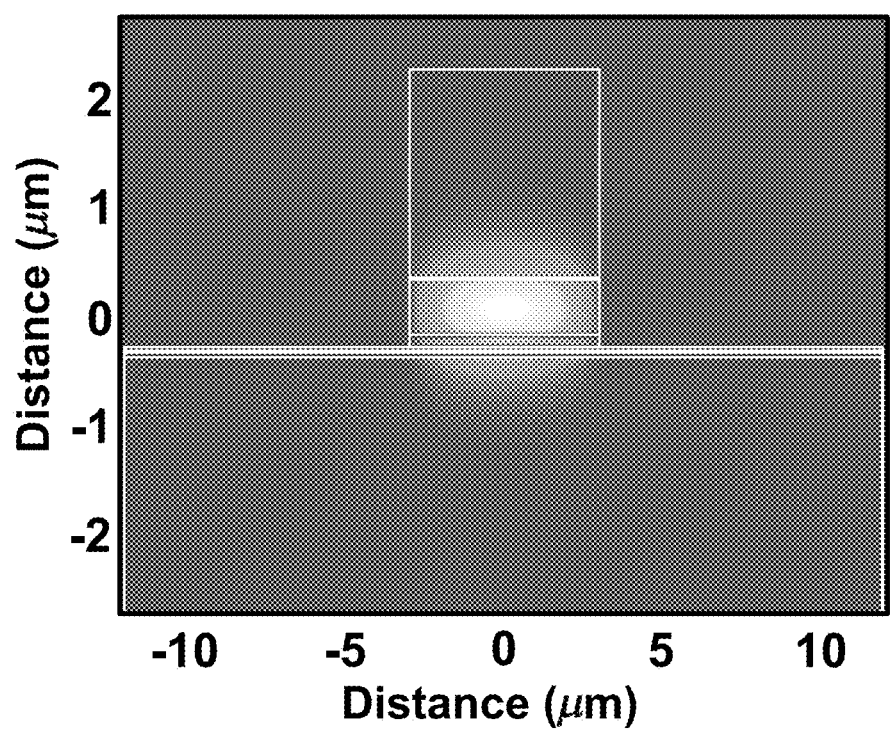
Figure 2C:
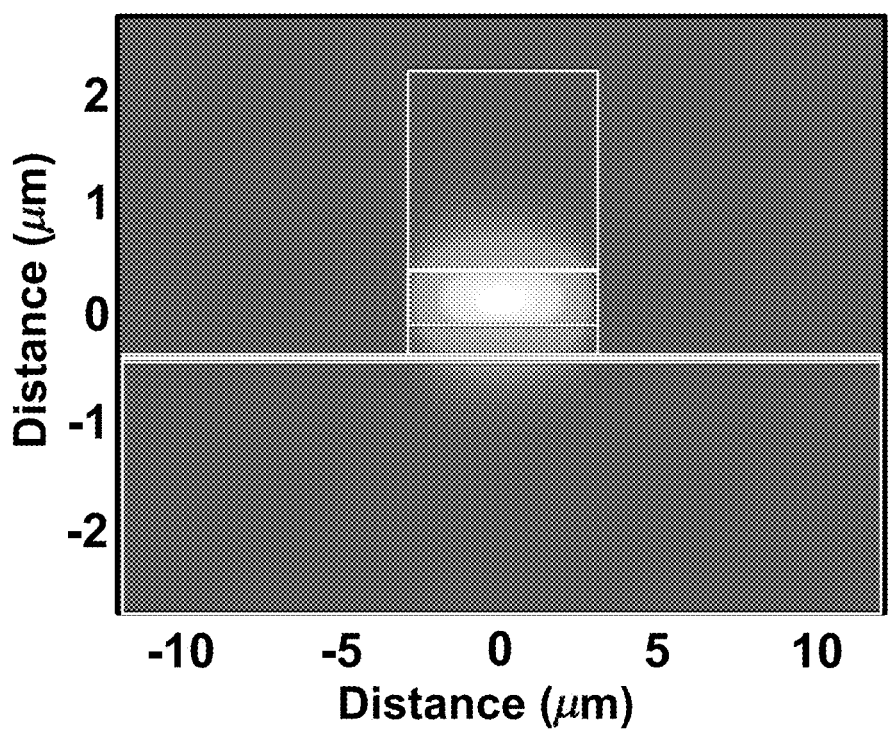

FIGS. 2A-2C illustrate cross-sectional views of the optical mode within the SOA 100 in the high-gain region 110, the mid-gain region 150, and the high-saturation region 160, respectively. As illustrated in each of FIGS. 2A-2C, the optical mode is well confined to the core 130, with relatively limited optical energy in the lower cladding layer 172, the upper cladding layer 134, and the confinement tuning layer 132. However, because the distance between the core 130 and the optical gain layer 140 increases from the high-gain region 110 to the high-saturation region 160 due to the increasing thickness of the confinement tuning layer 132, the optical confinement factor/' decreases.

Figure 3:
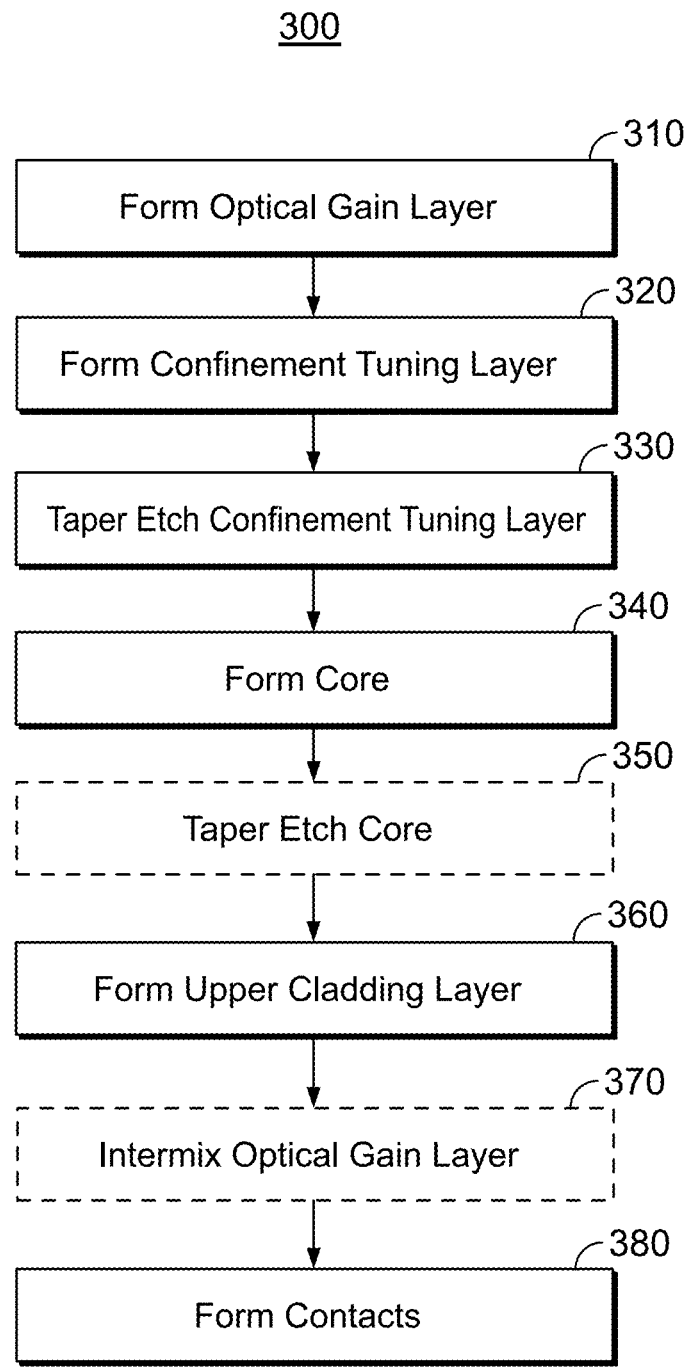
FIG. 3 is a flowchart illustrating a process flow that may be employed to fabricate a semiconductor optical amplifier in accordance with one or more embodiments.

FIG. 3 is a flowchart illustrating a process flow 300 in accordance with one or more embodiments that may be employed to fabricate a SOA in accordance with one or more embodiments. In step 310, an optical gain layer is formed on a substrate that includes a previously formed lower cladding layer. In step 320, a confinement tuning layer is formed on the optical gain layer. The confinement tuning layer will have a uniform thickness after step 320. In step 330, the confinement tuning layer is etched to form a tapered confinement tuning layer. The tapered confinement tuning layer may, for example, have a thickness profile such as that illustrated in FIG. 1 after step 330. In step 340, a core is formed on the tapered confinement tuning layer. The core will have a uniform thickness after step 340. In optional step 350, the core is etched to form a tapered core section. The tapered core section may, for example, have a thickness profile such as that illustrated in FIG. 1 after step 350, with the tapered core section corresponding to the spot-size converter region 180. In step 360, an upper cladding layer is formed on the core layer. In optional step 370, the portion of the optical gain layer in the spot-converter region is intermixed to shift the absorption energy of this portion of the optical gain layer to a higher energy, thereby making this portion of the optical gain layer substantially transparent at the operating wavelength. Further, by intermixing this portion of the optical gain layer, it may become electrically passive. In step 380, contacts are formed to permit biasing of the optical gain layer.

The substrate may be formed of any suitable material. As the remainder of the SOA is formed on the substrate, it is preferred that a lattice constant of the substrate be matched or approximately matched to the lattice constants of the remainder of the SOA. In various embodiments of the present invention, the substrate may, for example, be formed of InP, GaAs, or be a heterogeneously integrated substrate in which, for example, the InP or GaAs is located, for example, on a Si or sapphire substrate.

The optical gain layer formed in step 310 may be of any suitable material compatible with the operating wavelength of the input optical signal. In one or more embodiments, the optical gain layer is formed of bulk material or a multiple quantum well (MQW) structure. When operating in the near infrared (NIR) range of 800 nm to 1.6 μm, the bulk material or MQW structure may, for example, be formed of one or more of InGaAsP, InGaAs, AlGaAs, InAlGaAs, or GaAs. The optical gain layer may be formed by any suitable technique. In one or more embodiments, the optical gain layer may be formed, for example, by a chemical vapor deposition (CVD) process or a molecular beam epitaxy (MBE) process.

The confinement tuning layer formed in step 320 may be formed of any suitable material compatible with the operating wavelength of the input optical signal. When operating in the NIR range, the confinement tuning layer may, for example, be formed of InP, GaAs, AlGaAs, or InGaP. In one or more embodiments, the optical gain layer may be formed, for example, by a CVD process or an MBE process.

The etching performed in step 330 may employ any suitable etching process. For example, the etching performed in step 330 may employ a diffusion limited wet etch and/or gray-scale lithography.

The core formed in step 340 may be formed of any suitable material and thickness compatible with the operating wavelength of the input optical signal. When operating in the NIR range, the core may, for example, be formed of InGaAsP, InGaAs, AlGaAs, GaAs, or InAlGaAs. In one or more embodiments, the optical gain layer may be formed, for example, by a CVD process or an MBE process.

The etching performed in optional step 350 may employ any suitable etching process. For example, the etching performed in step 350 may employ a diffusion limited wet etch in conjunction with gray-scale lithography.

The upper cladding layer formed in step 360, as well as the lower cladding layer formed prior to step 310, may each be formed of any suitable material compatible with the operating wavelength of the input optical signal. When operating in the NIR range, the upper and lower cladding layers may each, for example, be formed of InP, GaAs, AlGaAs, or InGaP. In one or more embodiments, the upper and lower cladding layers may be formed, for example, by a CVD process or an MBE process.

The intermixing performed in optional step 370 may employ any suitable intermixing process. For example, the intermixing performed in step 370 may employ an ion implantation followed by a rapid thermal anneal.

The contacts formed in step 380 may be formed of any suitable material or combination of materials. Further, the contacts formed in step 380 may include a single layer or multiple layers. The primary consideration for the contacts is that they form low resistance ohmic contacts with the material(s) upon which they are formed. The contacts may, for example, be formed of Ti/Pt/Au, AuGe/Ni/Au, or BeAu/Ni/Au.

Figure 4:
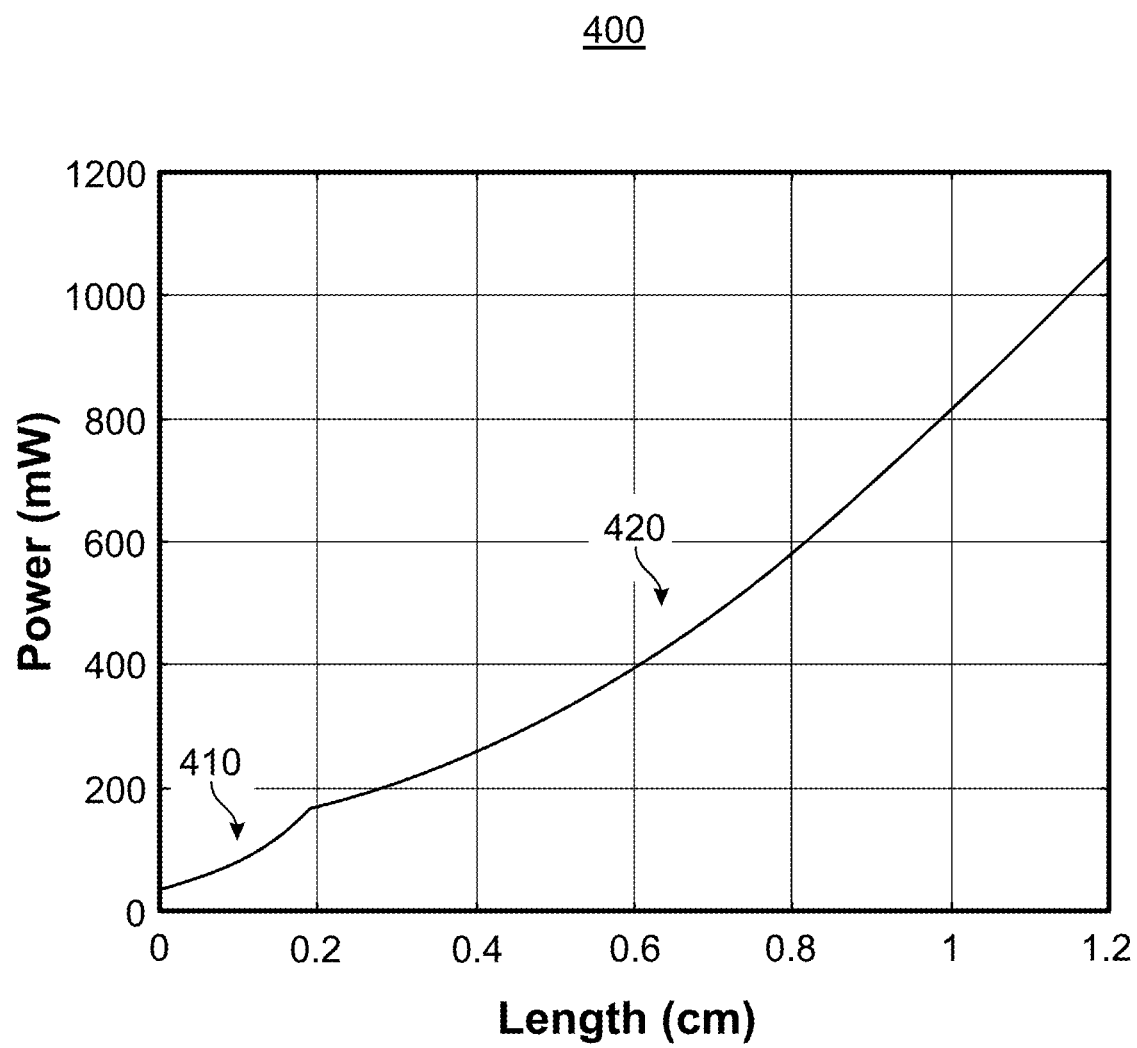
FIG. 4 illustrates a calculated optical power curve as a function of position (length) within a semiconductor optical amplifier in accordance with one or more embodiments.

FIG. 4 illustrates a calculated optical power curve 400 as a function of position (length) within an SOA of a representative embodiment. As illustrated in FIG. 4, the gain of the SOA is greatest in region 410 of the optical power curve 400, which corresponds to the high-gain region 110 of the SOA 100 illustrated in FIG. 1. While the overall power continues to increase in region 420 of the optical power curve 400, the gain decreases as the core moves further from the optical gain layer and the optical confinement factor Γ decreases. Region 420 of the optical power curve 400 corresponds to both the mid-gain region 150 and the high-saturation region 160 of the SOA 100 illustrated in FIG. 1.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:
1. A semiconductor optical amplifier comprising:
a lower cladding layer;
an optical gain layer on the lower cladding layer, the optical gain layer adapted to provide optical gain to an optical signal;
a confinement tuning layer on the optical gain layer;
a core on the confinement tuning layer, the core having a first core thickness; and
an upper cladding layer on the core;
wherein the lower cladding layer, the confinement tuning layer, the core, and the upper cladding layer are adapted to collectively guide the optical signal;
wherein a thickness of the confinement tuning layer in a high-gain region has a first confinement layer thickness, the confinement tuning layer in the high-gain region adapted to produce a first optical confinement factor;
wherein the thickness of the confinement tuning layer in a mid-gain region adjacent the high-gain region is continuously tapered from the first confinement layer thickness to a second confinement layer thickness, the second confinement layer thickness greater than the first confinement layer thickness; and
wherein the thickness of the confinement tuning layer in a high-saturation region adjacent the mid-gain region has the second confinement layer thickness, the confinement tuning layer in the high-saturation region adapted to produce a second optical confinement factor, the second optical confinement factor less than the first confinement factor.

2. The semiconductor optical amplifier of claim 1, wherein the optical gain layer includes one of bulk material or multiple quantum wells.

3. The semiconductor optical amplifier of claim 2, wherein the bulk material or multiple quantum wells include at least one of InGaAsP, InGaAs, AlGaAs, InAlGaAs, or GaAs.

4. The semiconductor optical amplifier of claim 1, wherein each of the lower cladding layer, the confinement tuning layer, and the upper cladding layer includes at least one of InP, GaAs, AlGaAs, or InGaP.

5. The semiconductor optical amplifier of claim 1, wherein the core includes at least one of InGaAsP, InGaAs, AlGaAs, GaAs, or InAlGaAs.

6. The semiconductor optical amplifier of claim 1, wherein the first core thickness is between approximately 500 Å and approximately 5,000 Å.

7. The semiconductor optical amplifier of claim 1, wherein the first confinement layer thickness is between approximately 100 Å and approximately 500 Å.

8. The semiconductor optical amplifier of claim 1, wherein the second confinement layer thickness is between approximately 1,000 Å and approximately 5,000 Å.

9. The semiconductor optical amplifier of claim 1, wherein the high-gain region has a length between approximately 10 µm and approximately 500 µm.

10. The semiconductor optical amplifier of claim 1, wherein the mid-gain region has a length between approximately 200 µm and approximately 5,000 µm.

11. The semiconductor optical amplifier of claim 1, wherein the high-saturation region has a length between approximately 1,000 µm and approximately 10,000 µm.

12. The semiconductor optical amplifier of claim 1,
wherein the first optical confinement factor is between approximately 2% and approximately 15%; and
wherein the second optical confinement factor is between approximately 0.1% and approximately 2.0%.

13. The semiconductor optical amplifier of claim 1, wherein a thickness of each of the lower cladding layer and the upper cladding layer is between approximately 1.5 µm and approximately 2.0 µm.

14. The semiconductor optical amplifier of claim 1 further comprising a substrate, the lower cladding layer on the substrate, the substrate including at least one of InP or GaAs.

15. The semiconductor optical amplifier of claim 1, wherein the core thickness in a spot-size converter region adjacent the high-saturation region is continuously tapered from the first core thickness to a second core thickness, the second core thickness less than the first core thickness.

16. The semiconductor optical amplifier of claim 15, wherein the second core thickness is between approximately 0 Å and approximately 300 Å.

17. The semiconductor optical amplifier of claim 15, wherein the spot-size converter region has a length between approximately 100 µm and approximately 500 µm.

18. The semiconductor optical amplifier of claim 15, wherein a portion of the optical gain layer in the spot-size converter region adjacent the high-saturation region is intermixed such that the portion of the optical gain layer in the spot-size converter region is substantially transparent to the optical signal.

19. The semiconductor optical amplifier of claim 1 further comprising two electrical contacts, the electrical contacts adapted to apply a bias across the optical gain layer.

20. The semiconductor optical amplifier of claim 19, wherein each of the two electrical contacts includes at least one of Ti, Pt, Au, Ge, Ni, or Be.

* * * * *